United States Patent
Stolpman

(10) Patent No.: US 8,294,526 B2
(45) Date of Patent: Oct. 23, 2012

(54) OVENIZED CRYSTAL OSCILLATOR ASSEMBLY

(75) Inventor: James L. Stolpman, Bloomingdale, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 12/571,774

(22) Filed: Oct. 1, 2009

(65) Prior Publication Data

US 2010/0085124 A1    Apr. 8, 2010

Related U.S. Application Data

(60) Provisional application No. 61/195,164, filed on Oct. 3, 2008.

(51) Int. Cl.
*H03L 1/04* (2006.01)

(52) U.S. Cl. .......... 331/70; 331/69; 331/108 C; 331/158

(58) Field of Classification Search .................... 331/69, 331/70, 108 C, 116 R, 158, 176
See application file for complete search history.

(56) References Cited

U.S. PATENT DOCUMENTS

| | | |
|---|---|---|
| 4,963,843 A | 10/1990 | Peckham |
| 5,438,219 A | 8/1995 | Kotzan |
| 5,920,146 A | 7/1999 | Carroll et al. |
| 6,133,674 A | 10/2000 | Fry |
| 6,501,340 B1 * | 12/2002 | Flood ............................ 331/69 |
| 6,664,864 B2 * | 12/2003 | Jiles et al. ..................... 331/176 |
| 6,759,913 B2 | 7/2004 | Biernacki |
| 6,946,919 B2 | 9/2005 | Knecht et al. |
| 2004/0135645 A1 * | 7/2004 | Koyama et al. ............... 331/158 |
| 2008/0018409 A1 | 1/2008 | Okubo |
| 2008/0156099 A1 * | 7/2008 | Ishii et al. ...................... 73/579 |
| 2008/0224786 A1 | 9/2008 | Stolpman |

* cited by examiner

*Primary Examiner* — Joseph Chang
*Assistant Examiner* — Jeffrey Shin
(74) *Attorney, Agent, or Firm* — Daniel J. Deneufbourg

(57) ABSTRACT

An oscillator assembly includes a substrate having a top surface, a bottom surface, and a plurality of side surfaces. At least one of the side surfaces has at least one castellation which is covered with conductive material and includes a lower end spaced from the bottom surface of the substrate. The space is defined by an elongate groove in the side surface which is devoid of conductive material and extends between the lower end of the castellation and the bottom surface of the substrate to eliminate the risk of a short circuit with any of the connection pads on a customer's motherboard. The oscillator assembly further incorporates an oscillator circuit in which a current limiting resistor is located in series between the power supply and the heater control circuit.

9 Claims, 4 Drawing Sheets

OVENIZED CRYSTAL OSCILLATOR ASSEMBLY

CROSS-REFERENCE TO RELATED APPLICATIONS

This application claims the benefit of the filing date and disclosure of U.S. Provisional Application Ser. No. 61/195,164 filed on Oct. 3, 2008 which is explicitly incorporated herein by reference as are all references cited therein.

FIELD OF THE INVENTION

This invention relates to oscillators and, more specifically, to a high performance, reduced size, low cost ovenized crystal oscillator assembly.

BACKGROUND OF THE INVENTION

Oscillators are well known devices for providing a reference frequency source. The oscillator typically has a quartz crystal or other resonator and also has electronic compensation circuitry to stabilize the output frequency.

Various methods are known for stabilizing the output frequency as the temperature of the oscillator changes. Temperature compensated crystal oscillators (TCXO) typically employ thermistors which generate a correction voltage that reduces the frequency variation over temperature. The correction voltage is usually applied to a varactor diode in the crystal circuit such that the crystal frequency may be varied by a small amount.

To obtain a more stable output, ovenized oscillators (OCXO) heat the temperature sensitive portions of the oscillator which are isolated from the ambient to a uniform temperature. Ovenized oscillators contain a heater, a temperature sensor, and circuitry to control the heater. The temperature control circuitry holds the crystal and critical circuitry at a precise, constant temperature. The best controllers are proportional, providing a steady heating current which changes with the ambient temperature to hold the oven at a precise set-point, usually about 10 degrees Centigrade above the highest expected ambient temperature.

Despite the benefits of the oscillators available today, there continues to be a need for a high performance, reduced size, low cost ovenized crystal oscillator.

SUMMARY OF THE INVENTION

The present invention is broadly directed to an electronic assembly which comprises a substrate having a top surface, a bottom surface, and a plurality of side surfaces and at least one electrically conductive castellation defined in one of the side surfaces which includes a lower end spaced from the bottom surface. The spacing between the lower end of the castellation and the bottom surface of the substrate is defined by a non-conductive groove defined in the side surface which extends between the lower end of the castellation and the bottom surface of the substrate.

The spacing and presence of a non-conductive groove between the conductive castellation and the bottom surface of the substrate eliminates the risk of contact between the conductive castellation and any of the conductive connection pads on a customer's motherboard and thus eliminates the risk of a short circuit.

In one embodiment of the present invention, the oscillator assembly comprises a substrate having top and bottom surfaces, opposed longitudinal side surfaces and opposed transverse side surface and a plurality of castellations are defined in each of the opposed longitudinal and transverse side surfaces. The castellations defined in each of the opposed longitudinal side surfaces extend between the top and bottom surfaces of the substrate. The plurality of castellations defined in each of the transverse side surfaces extend from the top surface and include a lower end which terminates in a groove which is defined in each of the transverse side surfaces and extends between the lower end of the plurality of castellations defined in each of the transverse side surfaces and the bottom surface of the substrate.

In one embodiment, one elongate groove is defined in each of the opposed transverse side surfaces and the groove has a depth which is greater than the depth of the plurality of castellations defined in each of the transverse side surfaces.

In another embodiment, a plurality of grooves are defined in each of the transverse side surfaces and each of the grooves has a depth greater than each of the respective plurality of castellations in the transverse side surfaces.

The oscillator assembly still further comprises a power supply, an oscillator circuit connected to the power supply, a heater control circuit, a temperature sensor in communication with the heater control circuit, a heater in communication with the heater control circuit and, in accordance with the present invention, a current limiting resistor connected between the power supply and the heater control circuit.

There are other advantages and features of this invention which will be more readily apparent from the following detailed description of the embodiments of the invention, the drawings, and the appended claims.

BRIEF DESCRIPTION OF THE DRAWINGS

These and other features of the invention can best be understood by the following description of the accompanying drawings as follows.

DETAILED DESCRIPTION

Figure 1:
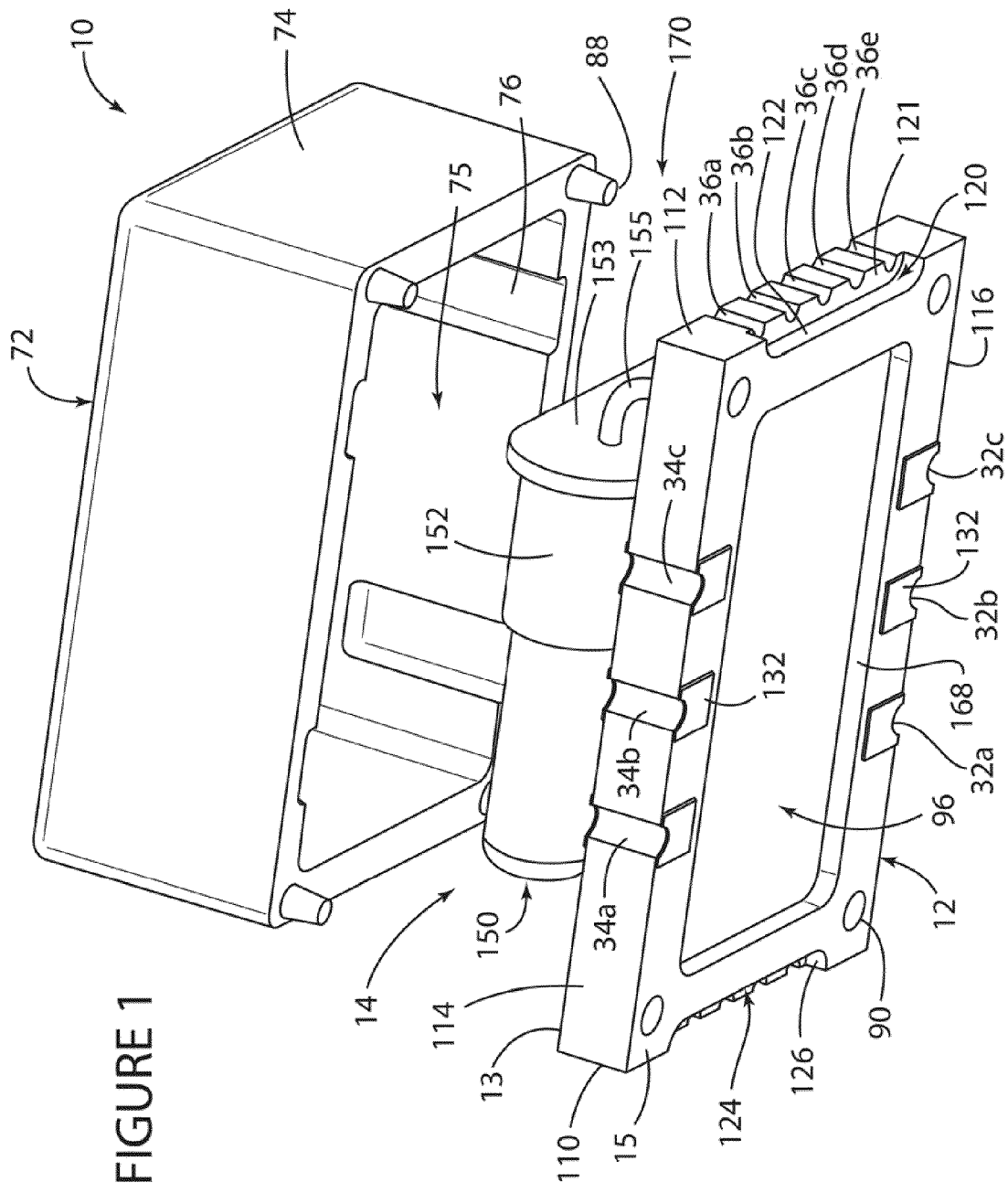
FIG. 1 is an enlarged simplified exploded perspective view of one embodiment of an ovenized crystal oscillator assembly in accordance with the present invention with the cover removed.
Figure 2:
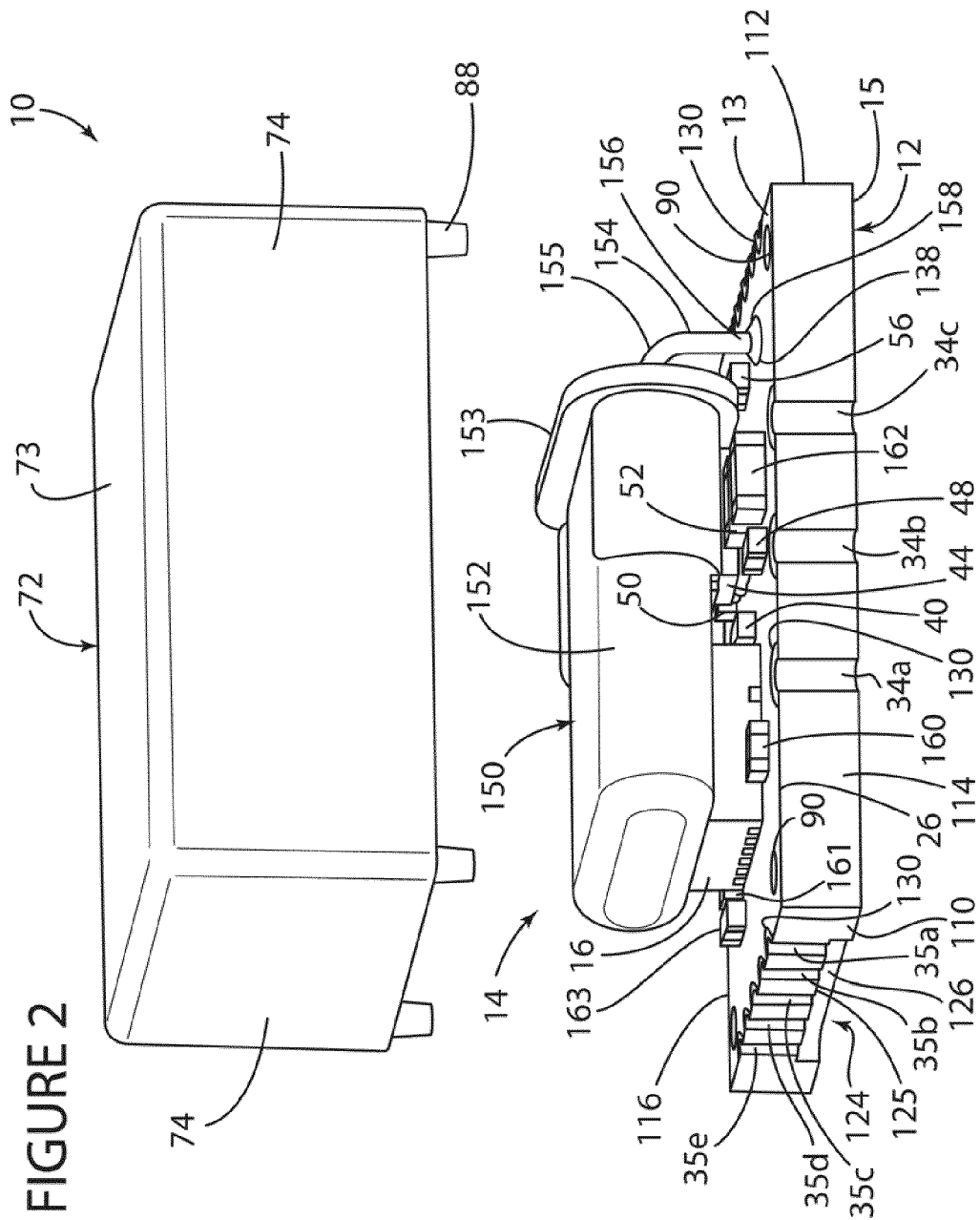
FIG. 2 is another enlarged simplified exploded perspective view of the ovenized oscillator assembly shown in FIG. 1.

One physical embodiment of an electronic assembly such as an ovenized crystal oscillator assembly or module 10 in accordance with the present invention is shown in FIGS. 1 and 2. The operating range of oscillator assembly 10 is preferably between about −5° C. to 70° C. Supply voltage is preferably 3.3 Vdc.

Ovenized crystal oscillator assembly 10 initially comprises a of a printed circuit board (PCB) or substrate 12 of standard glass epoxy laminate, multi-layer construction on which at least the following electrical/electronic components/circuits have been mounted to and/or defined on the top surface 13 thereof: a temperature compensated crystal oscillator (TCXO) assembly 14 which, in the embodiment shown, includes a crystal resonator 150; a temperature compensation integrated circuit (IC) 16; and an oven control and heater circuit 20 (FIG. 3) including, in part, an integrated circuit (IC)

oven/heater controller 44, heater elements 48, 50, and 52 and capacitors 160, 161, 162, and 163.

Generally rectangular printed circuit board (PCB) or substrate 12 has dimensions of less than about 5 mm wide and 7 mm long. Substrate 12 has a substantially planar horizontal top surface 13 that is opposed to a substantially planar horizontal bottom surface 15.

Substrate 12 has opposed parallel substantially vertical transverse walls or side surfaces 110 and 112 and opposed parallel substantially vertical longitudinal walls or side surfaces 114 and 116. Side surfaces 110, 112, 114 and 116 are arranged in an orientation that is substantially normal to top and bottom surfaces 13 and 15. Side surfaces 110, 112, 114 and 116 extend around the outer periphery of PCB/substrate 12.

Three spaced-apart, parallel semi-circular castellations 32a, 32b, 32c (FIG. 1) are formed in longitudinally extending side surface 116 and extend between, and in a relationship generally normal to, the top and bottom surfaces 13 and 15. Three spaced-apart, parallel, semi-circular castellations 34a, 34b, 34c (FIGS. 1 and 2) are located in opposed longitudinally extending side surface 114 and extend between, and in a relationship generally normal to, the top and bottom surfaces 13 and 15 and diametrically opposed to castellations 32a, 32b, and 32c.

As shown in FIG. 1, a pair of walls 121 and 122 are formed in side surface 112. Walls 121 and 122 are oriented generally normal to each other and together form an interior shoulder in side surface 112 defining an elongated, longitudinally extending recess, cutout, or groove 120 in side surface 112. Wall 121 is parallel to, and located between, top and bottom surfaces 13 and 15. Wall 122 is parallel to, but offset inwardly from, side surface 112. Recess 120 and wall 122 both extend upwardly from bottom surface 15 in the direction of upper surface 13 and terminate in wall 121.

Five spaced-apart, parallel semi-circular castellations 36a, 36b, 36c, 36d and 36e (FIG. 1) are located on and formed in side surface 112 and extend between the wall 121 defining the recess 120 and the top surface 13. More specifically, castellations 36a-36e extend generally vertically downwardly along side surface 112 from the top surface 13 to a point along the width of side surface 112 which is spaced from and short of the bottom surface 15 and the recess or cutout 120 defines an elongate gap or notch or groove in the side surface 112 which, in the vertical direction, extends between the lower end of each of the castellations 36a-36e and the bottom surface 15. The wall 121 is located at and intersects the lower end of each of the respective castellations 36a-36e.

Similarly, as shown in FIG. 2, a pair of walls 125 and 126 are formed in side surface 110. Walls 125 and 126 are oriented generally normal to each other and together form an interior shoulder in side surface 110 which defines an elongated, longitudinally extending recess, cutout, or groove 124 in side surface 110. Wall 125 is parallel to, and located between, top and bottom surfaces 13 and 15. Wall 126 is parallel to, but offset inwardly from, side surface 110. Recess 124 and wall 126 extend upwardly from bottom surface 15 in the direction of top surface 13.

Five spaced-apart, parallel semi-circular castellations 35a, 35b, 35c, 35d and 35e (FIG. 2) are located on and formed in side surface 110 and extend between the wall 125 and top surface 13. More specifically, the castellations 35a-35e (FIG. 2) extend generally vertically downwardly along the width of side surface 110 from the top surface 13 to a point along the width of side surface 110 which is spaced from and short of the bottom surface 15 and the recess 124 defines a gap or notch or groove in the side surface 110 which, in the vertical direction, extends between the lower end of respective castellations 35a-35e and the bottom surface 15. The wall 125 is located at and intersects the lower end of each of the respective castellations 36a-36e.

Each of the castellations 32a-32c, 34a-34c, 35a-35e, and 36a-36e is defined by a generally semi-circularly-shaped elongate groove which is formed in the respective side surfaces 110, 112, 114, and 116; extends in an orientation generally normal to the top and bottom surfaces 13 and 15; and includes an outer surface covered/coated with a layer of electrically conductive material, such as copper or the like, to define a path for electrical signals.

Each of the castellations 32a-32c, 34a-34c, 35a-35e and 36a-36e has an attached generally semi-circular-shaped pad 130 of conductive material (FIG. 2) that surrounds the top respective openings thereof which terminate in top surface 13. Each of the castellations 32a-c and 34a-c further has an attached respective generally rectangularly-shaped pad 132 of conductive material (FIG. 1) that surrounds the respective bottom openings thereof which terminate in bottom surface 15.

In the embodiment of FIGS. 1 and 2, each of the recesses or grooves 120 and 124 in respective side surfaces 112 and 110 extends into the respective side surfaces 112 and 110 a depth which is greater than the radius of the respective castellations 36a-36e and 35a-35e to create the respective horizontal walls 121 and 125 located at the lower ends of respective castellations 36a-36e and 35a-35e. Additionally, the respective walls 121, 122, 125, and 126 in respective side surfaces 112 and 110 of PCB/substrate 12 which define the respective grooves 120 and 124 are devoid of any conductive material and thus the respective recesses or grooves 120 and 124 defined by the respective walls 121, 122, 125, and 126 insure that there is a space or gap, and thus no electrical contact or connection, between the electrically conductive lower ends of respective castellations 35a-35e and 36a-36e and any of the electrically conductive connection pads on a customer's motherboard (not shown) on which the PCB/substrate 12 is adapted to be seated. The spacing between the respective castellations 35a-35e and 36a-36e and the bottom surface 15 thus eliminates the risk of creating a short between the PCB/substrate 12 and any of the electrically conductive connection pads on a customer's motherboard.

Although not described or shown herein in any detail, PCB/substrate 12 additionally includes a plurality of circuit lines formed and located on both the top surface 13 and in internal planes or layers thereof to electrically connect the various elements on the top surface 13 to each other and/or to any one or more of the castellations 32a-32c, 34a-34c, 35a-35e, and 36a-36e. For example, in the embodiment of FIGS. 1 and 2, the layer of conductive material which covers the outer surface of each of the respective castellations 35a-35e and 36a-36e may be coupled to a layer or strip of conductive material (not shown) extending through the interior of the PCB/substrate 12 and terminating in the conductive material on the outer surface of one or more of the castellations 35a-35e and 36a-36e.

As described above and shown in FIGS. 1 and 2, several electronic components are mounted on the top surface 13 of PCB/substrate 12 using conventional electronic assembly techniques such as surface mount placement and soldering.

Temperature compensation integrated circuit 16 (FIG. 2) is located and mounted generally centrally on the top surface 13 of PCB/substrate 12.

A temperature sensing element or sensor 40 (FIG. 2), which in the embodiment shown is in the form of a thermistor, is located on the top surface 13 of PCB/substrate 12 adjacent to temperature compensation integrated circuit 16 and below the crystal 150. Thermistor 40 is designed and positioned on PCB/substrate 12 to sense the temperature of crystal 150.

Crystal 150 (FIGS. 1 and 2) is a conventional AT or SC cut quartz crystal resonator adapted to resonate at a pre-determined frequency. Crystal 150 is packaged in a metal can 152 that has a base 153. Electrical leads 154 extend from the base 153. Leads 154 have opposed ends 155 and 156. Lead ends 155 extend into can 152 and lead ends 156 extend into respective bores 138 in top surface 13 of PCB 12. Solder 158 retains ends 156 in bores 138.

Temperature sensor 40 is connected to oven control and heater circuit 20 (FIG. 3) and, more specifically, to integrated circuit oven/heater controller 44 which, in turn, is connected to and controls the plurality of heater elements 48, 50, and 52 (FIG. 2). In the embodiment shown, heater elements 48, 50, and 52 comprise resistors and the integrated circuit oven/heater controller 44 integrates an amplifier.

Integrated circuit oven/heater controller 44 receives a temperature signal as an input from temperature sensor 40 and provides a heater control signal as an output. When the temperature in the oven defined by the interior of the lid/cover 72 (FIGS. 1 and 2) falls below a selected value, the integrated circuit oven/heater controller 44 increases power to the heater elements to increase the temperature inside the oven. When the temperature in the oven increases above a selected value, integrated circuit oven/heater controller 44 reduces power to the heater elements 48, 50, and 52 to allow a decrease in the temperature inside the oven.

Integrated circuit oven/heater controller 44 and the plurality of heater elements 48, 50, and 52 are located on the top surface 13 of PCB/substrate 12 generally below crystal 150 (FIG. 2) to provide an evenly distributed balanced heating of the crystal 150. Capacitors 160, 161, 162, and 163 are arranged on the top surface 13 of PCB/substrate 12 to perform appropriate filtering and de-coupling functions.

Temperature sensor 40 is centrally located on top surface 13 adjacent the right side edge of temperature compensation integrated circuit 16. Integrated circuit oven/heater controller 44 is located adjacent and to the right of temperature sensor 40.

Heater element 48 is located below and spaced from the lower right corner edge of temperature compensation integrated circuit 16. Heater element 50 is located above and spaced from the upper right corner of temperature compensation integrated circuit 16. Heater element 52 is located below and spaced from the lower edge of integrated circuit oven/heater controller 44. Heater element 54 is located between bores 138 toward printed circuit board side surface 112.

Heater elements 48, 50, and 52 and capacitors 160, 161, 162, and 163 together form part of the oven control and heater circuit 20. The particular application and desired performance of oscillator assembly 10 determines the number, selection, placement, interconnection, and values of the various elements defining the oven control and heater circuit 20.

In the embodiment of FIG. 2, crystal 150 overlies at least the temperature compensation integrated circuit 16, the integrated circuit oven/heater controller 44, the temperature sensor 40, and the heater elements 48, 50, and 52. In the embodiment shown, crystal 150 is seated over the top of temperature compensation integrated circuit 16 (FIG. 2).

As shown in FIGS. 1 and 2, oscillator assembly 10 further comprises an outer lid/cover 72 which preferably covers the full top surface 13 of PCB/substrate 12. Lid 72 includes a top or roof 73 and four downwardly depending walls 74 defining respective lower peripheral end faces or edges adapted to be seated on the top surface 13. The walls 74 and top surface 73 of lid 72 together define an interior cavity 75. Grooves 76 (FIG. 1) are defined in and extend into the inner surface of selected ones of the walls 74. Lid 72 can be made from an insulating material such as plastic. Lid/cover 72 and, more specifically, interior cavity 75 thereof define an interior oven which assists in keeping the oscillator assembly 10 and the components thereof at a constant temperature, thus reducing the power requirements of the oscillator assembly 10. The total height of the oscillator module 10 with the lid 72 is about 5.5 mm.

Four spaced-apart, downwardly projecting feet, posts or prongs 88 extend downwardly from the corners of the lid 72. Posts 88 are inserted into four respective holes or cavities 90 defined in the top surface 13 of PCB/substrate 12.

The feet 88 in combination with the respective cavities 90 serve to locate and secure the lid 72 to the PCB/substrate 12. The lid 72 is preferably sized to cover all of the electrical components seated on top surface 13 including at least the temperature compensation integrated circuit 16, the temperature sensor 40, and the crystal 150.

The heat generated by integrated circuit oven/heater controller 44 and heater elements 48, 50, and 52 is transferred upwardly to the overlying crystal 150 to allow the even and distributed heating of crystal 150.

Referring back to FIG. 1, four walls 168 extend into the bottom surface 15 of PCB/substrate 12 to define a recess or cavity or pocket 96 in the bottom surface 15 of PCB/substrate 12. Pocket 96 protrudes into the bottom surface 15 and interior of PCB/substrate 12.

Cavity or pocket 96 is preferably located in a region of PCB/substrate 12 located directly beneath the region on the top surface 13 of PCB/substrate 12 containing the crystal 150. Air is trapped in the cavity or pocket 96 and defines a layer or region of insulation between the top and bottom surfaces 13 and 15.

Figure 3:
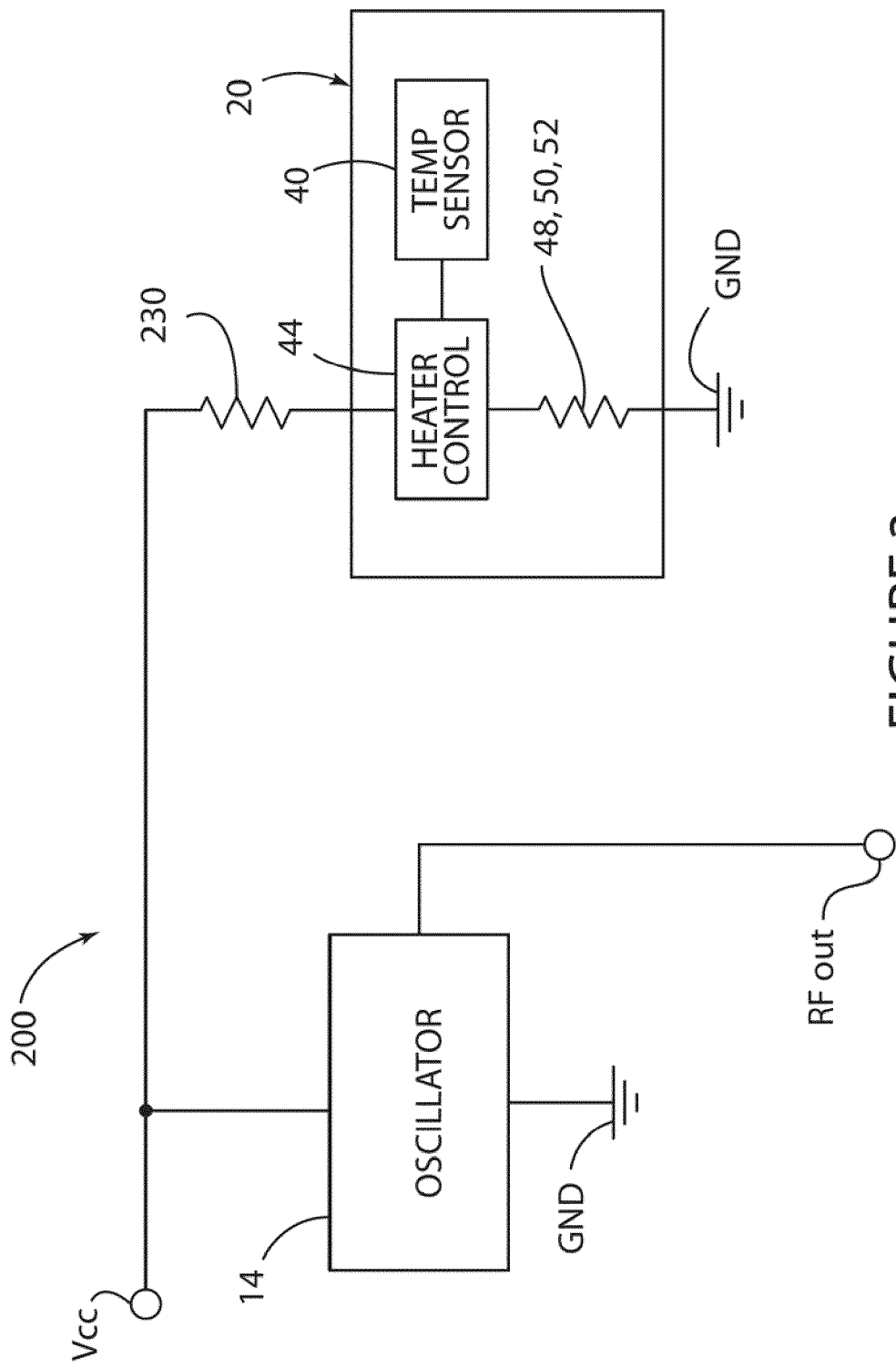
FIG. 3 is a schematic block diagram of the oscillator circuit of the ovenized crystal oscillator assembly in accordance with the present invention.

FIG. 3 depicts one embodiment of an oscillator circuit 200 for oscillator assembly 10 in which oscillator 14 is connected to a power supply terminal Vcc, a ground terminal GND, and an RF output terminal RF out. Oscillator 14 can be a Colpitts oscillator that is stabilized with an AT cut quartz crystal. Oscillator circuit 200 generates a stable reference frequency at RF output terminal RF out.

Ovenized oscillator circuit 200 includes oven control and heater circuit 20. As discussed above, oven control and heater circuit 20 comprises at least integrated circuit oven/heater controller circuit 44, temperature sensor 40 and heater resistors 48, 50, and 52. Integrated circuit oven/heater controller 44 is connected to both the temperature sensor 44 and heater resistors 48, 50, and 52. Heater resistors 48, 50, and 52, in turn, are connected to ground terminal GND. Temperature sensor 40 provides a temperature sensor signal to integrated circuit oven/heater controller 44 which, in turn, regulates the current applied to heater resistors 48, 50, and 52 and regulates the temperature sensed by the oscillator 14.

A current limiting resistor 230 is connected between the integrated circuit oven/heater controller 44 and the power supply terminal Vcc to assure that the turn on current of oscillator module 10, and more specifically, the turn on current of integrated circuit oven/heater controller 44, does not exceed the rated current capability of the customer's power supply.

Specifically, current limiting resistor 230 reduces the voltage to integrated circuit oven/heater controller 44 by an amount equal to the current flowing through resistor 230 multiplied by the resistance value of resistor 230. For example, assume that current limiting resistor 230 has a value of 3.3 ohms. If the integrated circuit oven/heater controller 44 turns on to its normal saturated state, there is about 2.6 volts (Vcc—the saturation voltage of the integrated circuit oven/heater controller 44) available across the 4 ohms impedance of the heater resistors 48, 50, and 52 plus the 3.3 ohms of current limiting resistor 230 for a total resistance of 7.3 ohm. The turn on current is then limited to 356 milliamps. The voltage drop across the 3.3 ohm current limiting resistor 230 will be about 1.2 volts. Therefore, integrated circuit oven/heater controller 44 must be able to operate at a supply voltage of 2.1 volts. Integrated circuit oven/heater controller 44 is configured to operate at this low voltage to control the output current.

The use of current limiting resistor 230 between integrated circuit oven/heater controller 44 and power supply Vcc causes the integrated circuit oven/heater controller 44 to supply more heat over the ambient temperature range than if the value of heater resistors 48, 50, and 52 is increased to limit the turn on current to the same value.

Analysis has shown that the heat produced by heater resistors 48, 50, and 52 can be reduced by 50% of what it would be if their values were increased. This includes the heat dissipated by current limiting resistor 230 in series with the power supply Vcc.

When the heat source in the oven defined by interior lid cavity 75 is evenly distributed over the ambient temperature range, the temperature of the oscillator 14 in the oven is more tightly controlled leading to a more stable reference frequency at terminal RF out.

Figure 4:
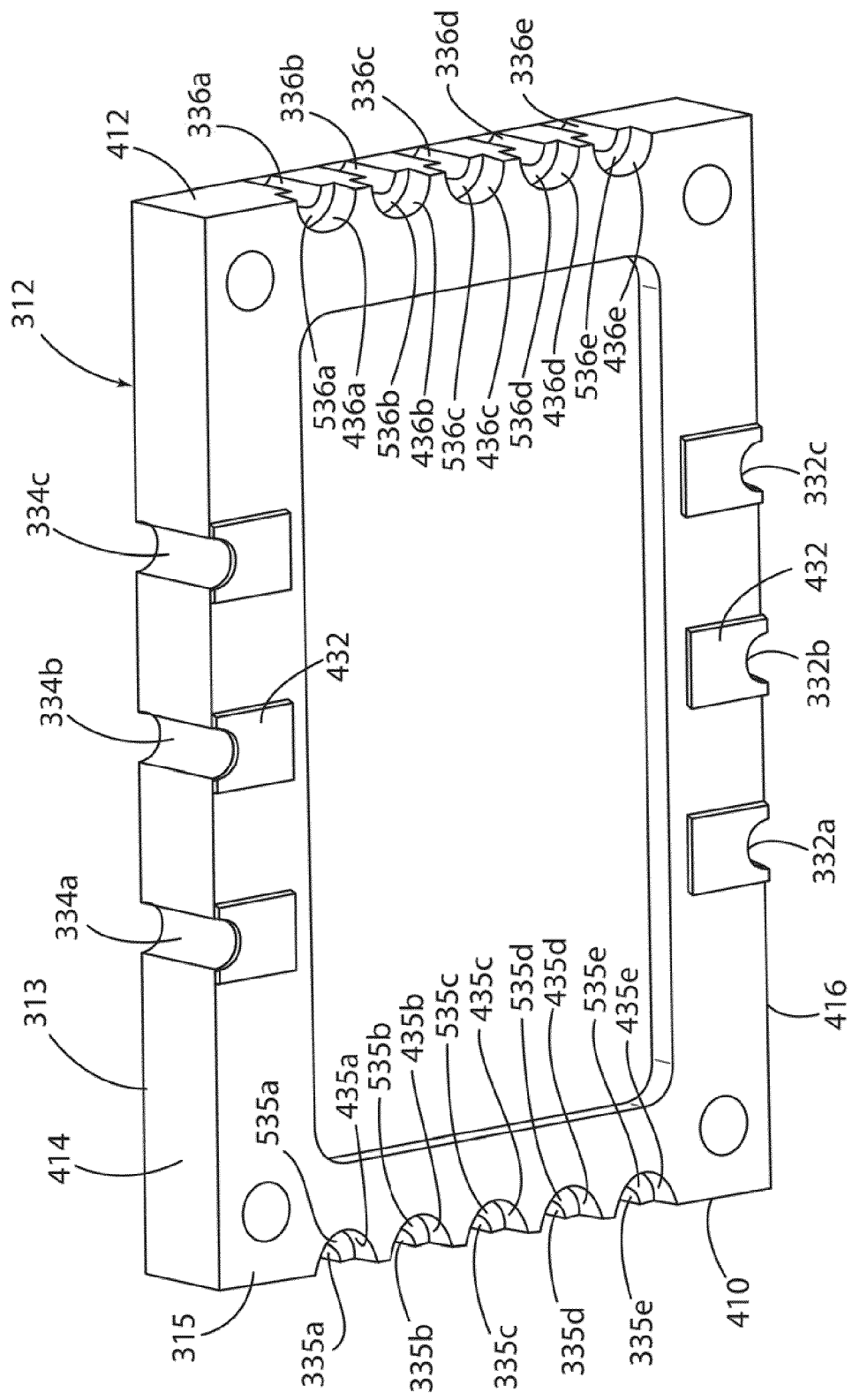
FIG. 4 is an enlarged bottom perspective view of another embodiment of the substrate of the ovenized crystal oscillator assembly in accordance with the present invention.

FIG. 4 depicts another PCB/substrate embodiment 312 for the oscillator assembly or module 10. Substrate 312, like substrate 12 described above in detail, is comprised of standard glass epoxy laminate, multi-layer construction on which the same electrical/electronic components/circuits, as described above and incorporated herein by reference, have been mounted to and/or defined on the top surfaces 13.

Generally rectangular printed circuit board (PCB) or substrate 312 has a substantially planar horizontal top surface 313 that is opposed to a substantially planar horizontal bottom surface 315. PCB/substrate 312 also has opposed parallel substantially vertical transverse walls or side surfaces 410 and 412 and opposed parallel substantially vertical longitudinal walls or side surfaces 414 and 416. Side surfaces 410, 412, 414, and 416 are arranged in an orientation that is substantially normal to the top and bottom surfaces 313 and 315. Side surfaces 410, 412, 414, and 416 extend around the outer periphery of substrate 312.

Three spaced-apart, parallel, semi-circular castellations 332a, 332b, and 332c are formed in longitudinally extending side surface 416 and extend between, and in a relationship generally normal to, the top and bottom surfaces 313 and 315. Three spaced-apart, parallel, semi-circular castellations 334a, 334b, and 334c are formed in opposed longitudinally extending side surface 414 and extend between top and bottom surfaces 313 and 315 in a relationship generally normal thereto and diametrically opposed to castellations 332a, 332b, and 332c.

Five spaced-apart, parallel, semi-circular castellations 335a, 335b, 335c, 335d, and 335e are formed in side surface 410. Five spaced-apart, parallel, semi-circular castellations 336a, 336b, 336c, 336d, and 336e are formed in side surface 412.

Each of the castellations 332a-332c, 334a-334c, 335a-335e, and 336a-336e is defined by a generally semi-circularly-shaped elongate groove which is formed in the respective side surfaces 410, 412, 414, and 416; extends in an orientation generally normal to the top and bottom surfaces 313 and 315 of PCB/substrate 312; and is covered/coated with a layer of conductive material, such as copper or the like, to define a path for electrical signals.

Each of the castellations 332a-332c, 334a-334c, 335a-335e, and 336a-336e has an attached respective semi-circularly-shaped pad 430 of conductive material that surrounds the top respective openings thereof terminating in the top surface 313. Castellations 332a-332c and 334a-334c additionally have an attached respective generally rectangularly-shaped pad 432 that surrounds the bottom respective openings thereof terminating in the bottom surface 315.

Each of the castellations 335a-335e and 336a-336e extends downwardly from the top surface 313 and terminates at a point in respective side surfaces 410 and 412 which is spaced from and short of the bottom surface 315 and respective semi-circularly-shaped elongate grooves or recesses defined by respective semi-circular-shaped vertical walls 435a-435e and 436a-436e extend between the lower end of the respective castellations 335a-335e and 336a-336e and the bottom surface 315.

The walls 435a-435e and 436a-436e are devoid of any conductive material and have a radius which is greater than the radius of respective castellations 335a-335e and 336a-336e to form respective horizontal walls 535a-535e and 536a-536e in respective side surfaces 410 and 412 which are located at the lower ends of the respective castellations 335a-336e and 336a-336e. Each of the walls 535a-535e and 536a-536e is disposed in a relationship generally parallel to and spaced from both the top and bottom surfaces 313 and 315 of PCB/substrate 312.

In accordance with this substrate embodiment 312, the formation of respective individual walls 435a-435e and 436a-436e defining respective individual recesses or grooves which extend between the lower ends of respective castellations 335a-335e and 336a-336e and the bottom surface 315 of PCT/substrate 312 insures that there is a space or gap and thus no contact between the electrically conductive lower end of each of the respective castellations 335a-335e and 336a-336e and any of the electrically conductive connection pads on the top surface of the customer's motherboard (not shown) on which the PCT/substrate 312 is adapted to be seated. The absence of such contact eliminates the risk of any short circuits between the substrate 312 and any of the electrically conductive connection pads on the customer motherboard.

Although not described or shown herein in ay detail, and in a manner similar to the earlier described PCB/substrate embodiment 12, it is understood that the substrate 312 defines a plurality of circuit lines formed and located on the top surface 313 and on other internal planes and layers of substrate 312 that are adapted to electrically connect the various elements to each other and/or to the castellations including, for example, internal layers or strips of conductive material terminating into one or more of the layers of conductive material which cover the exterior surface of respective castellations 335a-335e and 336a-336e.

While the invention has been taught with specific reference to the above described embodiments of the ovenized oscillator assembly, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An electronic assembly comprising a substrate having a top surface, a bottom surface, and a plurality of side surfaces and at least one electrically conductive castellation defined in one of the side surfaces, the castellation including a lower end spaced from the bottom surface of the substrate and a non-conductive groove being formed in the one of the side surfaces of the substrate including the castellation, the groove extending between the lower end of the castellation and the bottom surface of the substrate.

2. An electronic assembly comprising a substrate having a top surface, a bottom surface, and a plurality of side surfaces and at least one electrically conductive castellation defined in one of the side surfaces, the castellation including a lower end spaced from the bottom surface of the substrate and a non-conductive groove being formed in the one of the side surfaces of the substrate including the castellation, the groove extending between the lower end of the castellation and the bottom surface of the substrate and the groove having a depth greater than the depth of the castellation.

3. The electronic assembly of claim 1 further comprising a plurality of spaced-apart electrically conductive castellations defined in at least one of the side surfaces of the substrate and including respective lower ends spaced from the bottom surface of the substrate and an elongate non-conductive groove is formed in the one of the side surfaces of the substrate with the plurality of castellations, the elongate groove extending from the bottom surface of the substrate and terminating in the respective lower ends of the plurality of castellations.

4. The electronic assembly of claim 1 further comprising a plurality of spaced-apart electrically conductive castellations defined in at least one of the side surfaces of the substrate and including respective lower ends spaced from the bottom surface of the substrate, and a plurality of spaced-apart non-conductive grooves formed in the one of the side surfaces of the substrate with the plurality of castellations, the plurality of grooves extending from the bottom surface of the substrate and terminating in the respective lower ends of the plurality of castellations.

5. An oscillator assembly comprising:
a substrate having a top surface, a bottom surface, opposed longitudinal side surfaces and opposed transverse side surfaces; and
a plurality of castellations defined in each of the opposed longitudinal and transverse side surfaces and covered with a conductive material, the castellations defined in each of the opposed longitudinal side surfaces extending between the top and bottom surfaces of the substrate, the plurality of castellations defined in each of the transverse side surfaces extending from the top surface and each including a lower end terminating in a groove defined in each of the transverse side surfaces, the groove being devoid of conductive material and extending between the lower end of the plurality of castellations defined in each of the transverse side surfaces and the bottom surface of the substrate.

6. The oscillator assembly of claim 5 wherein one elongate groove is defined in each of the opposed transverse side surfaces.

7. An oscillator assembly comprising:
a substrate having a top surface, a bottom surface, opposed longitudinal side surfaces and opposed transverse side surfaces; and
a plurality of castellations defined in each of the opposed longitudinal and transverse side surfaces and covered with a conductive material, the castellations defined in each of the opposed longitudinal side surfaces extending between the top and bottom surfaces of the substrate, the plurality of castellations defined in each of the transverse side surfaces extending from the top surface and each including a lower end terminating in an elongate groove defined in each of the transverse side surfaces, the groove being devoid of conductive material and extending between the lower end of the plurality of castellations defined in each of the transverse side surfaces and the bottom surface of the substrate, the elongate groove in each of the transverse side surfaces having a depth which is greater than the depth of the plurality of castellations defined in each of the transverse side surfaces.

8. The oscillator assembly of claim 5 wherein a plurality of grooves are defined in each of the transverse side surfaces.

9. An oscillator assembly comprising:
a substrate having a top surface, a bottom surface, opposed longitudinal side surfaces and opposed transverse side surfaces; and
a plurality of castellations defined in each of the opposed longitudinal and transverse side surfaces and covered with a conductive material, the castellations defined in each of the opposed longitudinal side surfaces extending between the top and bottom surfaces of the substrate, the plurality of castellations defined in each of the transverse side surfaces extending from the top surface and each including a lower end terminating in a plurality of grooves defined in each of the transverse side surfaces, the groove being devoid of conductive material and extending between the lower end of the plurality of castellations defined in each of the transverse side surfaces and the bottom surface of the substrate, each of the plurality of grooves in each of the transverse side surfaces having a depth greater than each of the respective plurality of castellations in the transverse side surfaces.

* * * * *